(12) United States Patent
Langston

(10) Patent No.: US 8,111,584 B1
(45) Date of Patent: Feb. 7, 2012

(54) OPTICAL SENSING ARRANGEMENTS

(75) Inventor: Robert John Langston, Somerset (GB)

(73) Assignee: Plessey Overseas Limited, Ilford, Essex (GB)

( * ) Notice: Subject to any disclaimer, the term of this patent is extended or adjusted under 35 U.S.C. 154(b) by 0 days.

(21) Appl. No.: 07/068,483

(22) Filed: Jun. 11, 1987

(51) Int. Cl.
*G01R 33/02* (2006.01)
(52) U.S. Cl. ........................................ 367/131; 367/128
(58) Field of Classification Search .................. 367/131, 367/140, 149, 153, 156, 168, 128, 127, 20
See application file for complete search history.

(56) References Cited

U.S. PATENT DOCUMENTS

| | | | | |
|---|---|---|---|---|
| 4,471,219 A | * | 9/1984 | Giallorenzi | 250/227.14 |
| 4,506,352 A | * | 3/1985 | Brandsaeter et al. | 367/20 |
| 4,516,021 A | * | 5/1985 | Taylor | 250/227.17 |
| 4,593,385 A | * | 6/1986 | Chamuel | 367/140 |
| 4,649,529 A | * | 3/1987 | Avicola | 367/149 |
| 4,653,033 A | * | 3/1987 | Posseme | 367/118 |
| 4,906,929 A | * | 3/1990 | Rempt | 250/227.19 |

FOREIGN PATENT DOCUMENTS

GB 2133737 A * 8/1984
GB 2374407 A * 10/2002

* cited by examiner

*Primary Examiner* — Daniel Pihulic
(74) *Attorney, Agent, or Firm* — Jacobson Holman PLLC

(57) ABSTRACT

A method of detecting a submerged vessel in or near the wake of a ship in which a plurality of optical fiber sensors are trailed from said ship and in which at least one of said sensors which is located in the ship's wake comprises a magnetically-responsive optical fiber sensor.

3 Claims, 1 Drawing Sheet

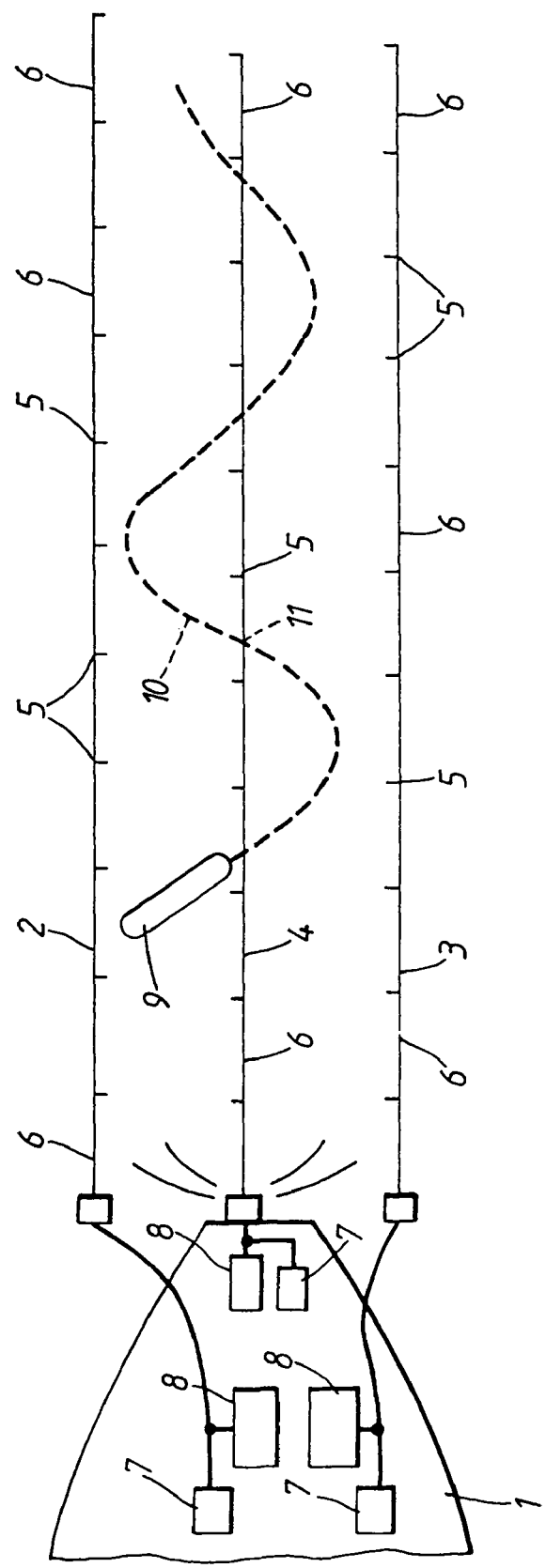

OPTICAL SENSING ARRANGEMENTS

This invention relates to optical sensing arrangements and relates more specifically to optical fibre sensing arrangements of the kind in which coherent light propagating along an optical fibre sensor undergoes a phase shift when acoustic pressure waves impinge on the optical fibre sensor. Such sensing arrangements are commonly used in hydrophones for detecting the presence of underwater vessels.

In our British Patent No. 2126820B a hydrophone is described in which an optical fibre sensor arranged to be trailed through the water comprises an optical fibre having distributed along its length a multiplicity of equally-spaced discontinuities which effectively divide the fibre sensor into a plurality of discrete fibre elements so that a small proportion of each coherent light signal transmitted along the fibre will be reflected back along the fibre to detection means from each of the discontinuities. The arrangement provides an acoustic wave sensor array the optical fibre elements of which will be caused to vary in length in response to the impingement thereon of acoustic pressure waves. Such changes in length of the fibre elements producing phase shifts in the transmitted light will be detected by the detection means using interferometric techniques.

Optical fibres which respond to acoustic pressure waves may also be coated with a strongly adherent film of magnetic material so that when the film is subjected to a magnetic field and undergoes a change in length due to the magneto-strictive effect the optical fibre also undergoes a corresponding change in length which varies the optical characteristics of the fibre thereby providing a phase shift in the light being transmitted along the fibre and measurable by means of an interferometer. Co-pending British Patent Application No. 8301112 relates to such magnetic field sensing fibres.

The present invention is based upon the realisation that a submerged vessel, or the equivalent thereof, present in/or near the wake of a ship can be positively detected, thereby avoiding the occurrence of false alarms due to noise generated by said wake, by trailing from the ship a plurality of optical fibre sensors which may be of the single element type, or of the multiple element type as described above, and at least one of said sensors which is located in the ship's wake comprising a magnetically-responsive optical fibre sensor.

In carrying out the present invention the magnetically-responsive optical fibre is preferably trailed along the centre of the ship's wake so that a following vessel zig-zagging along the ship's wake and crossing the fibre sensor will be detected by the magnetically-induced phase or frequency shift produced in coherent light signals propagating along the fibre due to the magneto-strictive effect of the following vessel's magnetic field causing a change in length of the optical fibre. The magnetically-responsive fibre will, however, also respond to acoustic pressure waves (i.e. radiated noise or individual acoustic transmission) produced by the following vessel.

Two acoustically-responsive optical fibres may be trailed by the ship outside its wake and located one on each side of the magnetically-responsive optical fibre. These acoustically-responsive fibres may be of the single element or multiple element type and coherent light signals transmitted thereat-ong will respectively undergo alternate increasing and decreasing phase shifts or modulations as the zig-zagging vessel moves along the ship's wake. Such phase modulations which will be detected by interferometric detection means in conjunction with phase modulation detected in the magnetically-responsive optical fibre as the following vessel crosses the latter fibre enables the zig-zagging vessel to be positively detected. If the three hydrophone fibres are of the single element type then the detected outputs from the hydrophones, together with a knowledge of the width of the ship's wake, enable the position of the following vessel and its rate of progress along the ship's wake to be determined from simple geometric considerations. The use of multiple element hydrophones would obviate the need for knowing the wake width.

As will be appreciated from the foregoing the present invention provides an optical sensing system which is capable of detecting and tracking moving vessels, or the like, within or close to the wake of a ship. The magnetically-responsive hydrophone provides an output which prevents false alarms that might otherwise be given due to the acoustically-responsive sensing fibres responding to noise generated by the ship's wake.

By way of example the present invention will now be described with reference to the single-FIGURE accompanying drawing.

Referring to the drawing, a ship 1 is provided with three hydrophones which comprise similar lengths of optical fibres 2, 3 and 4 (e.g. up to 5 km in length) which are trailed behind the ship 1 in the ship's wake as illustrated. Each of these trailing optical fibres has a multiplicity of equally spaced partially reflective discontinuities 5 distributed along it's length. This effectively serves to divide the optical fibres 2, 3 and 4 into a plurality of discrete fibre sensing elements 6. Each of the three hydrophones referred to will also include light source means 7 (e.g. laser) for producing coherent light signals for transmission down the respective optical fibres 2, 3 and 4. As these light signals propagate simultaneously along the respective optical fibre sensors a small proportion of each light signal will be reflected back along the optical fibre to optical detector means 8 where the reflective signals are monitored and measured using interferametric techniques.

When the optical fibres 2, 3 and 4 are subjected to acoustic pressures the lengths of the discrete optical fibre sensing elements 5 will vary according to the intensity of the acoustic pressure and by so doing the coherent light signal propagating along the optical fibre will undergo a phase shift. The magnitude of the phase shift and the position along the optical fibre at which the phase shift is initiated by the change in length of one or more of the optical fibre elements 5 will be detected and measured by the detector means 7. It will be appreciated therefore that if a submerged vessel 9 were tracking the ship 1 along the wake of the ship and following a zig-zag path 10 in order to avoid detection the optical fibres 2 and 3 would alternately undergo significant changes in length due to the radiated noise from the submerged'vessel 9 as the latter draws near to the respective optical fibre sensors.

The magnitude and position of these changes in length along the optical fibres can be detected and measured by the detector means in order to determine the position of the following vessel 9 relative to the ship 1. However, due to the relatively high level of variable noise generated by the wake of the ship 1 false alarms may possibly be generated as a result of the changes in length of the sensor fibres due to this wake noise.

With a view to overcoming this problem the centre optical fibre sensor 4 which will also respond to acoustic noise is provided along it's length with a strongly adherent magnetic coating whereby the length of the optical fibre 4 will undergo an change in length due to the magneto-strictive effect when the following vessel 9 actually crosses over the sensor fibre 4 at the point 11 for example, when following it's zig-zag path. The transitory change in length which will occur in one or more of the optical fibre elements 6 of the optical fibre sensor 4 due to the magneto-strictive effect will cause a localised phase shift in the light propagating along the sensor fibre 4 and the phase shift can be monitored and measured by the detector means in order positively to establish the presence of the following vessel 9, in conjunction with the monitored phase shifts in the sensor fibres 2 and 3 due to acoustic pressure as the following vessel draws near to these fibres along it's zig-zag path.

As will readily be appreciated, the noise produced by the wake of the ship 1 will not produce a transitory change in phase shift of light propagating along the centre fibre 4 due to a magneto-strictive effect and consequently false alarms due to acoustic pressure from the ship's wake can be positively avoided.

The invention claimed is:

1. A method for enabling a submerged vessel to be detected by an optical hydrophone system in or near an acoustically noisy environment of a ship's wake in which a plurality of optical fibre sensors are trailed from a ship and at least one of said sensors is located in the ship's wake and comprises a magnetically-responsive optical fibre sensor, in which the magnetically-responsive optical fibre is trailed along the centre of the ship's wake between two non-magnetically responsive optical fibre sensors.

2. A method as claimed in claim 1, in which the optical fibre sensors are provided along their lengths with equally spaced partially reflective discontinuities which serve to reflect a small proportion of the light propagating along the fibres and in which the optical fibre sensors have detector means associated therewith for detecting phase shifts in the propagating light due to acoustic pressures impinging on the fibre sensors and due to the magneto-strictive effect as a vessel following the ship crosses the magnetically responsive optical fibre.

3. A method as claimed in claim 2, in which the phase shifts occurring in the optical fibres are detected using interferometric techniques.

* * * * *